(12) United States Patent
Han

(10) Patent No.: US 11,464,120 B2
(45) Date of Patent: *Oct. 4, 2022

(54) MEMORY CARD AND MEMORY CARD SOCKET

(71) Applicant: Samsung Electronics Co., Ltd., Suwon-si (KR)

(72) Inventor: Seok-jae Han, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/218,232

(22) Filed: Mar. 31, 2021

(65) Prior Publication Data

US 2021/0219441 A1 Jul. 15, 2021

Related U.S. Application Data

(63) Continuation of application No. 16/504,548, filed on Jul. 8, 2019, now Pat. No. 10,980,138.

(30) Foreign Application Priority Data

Jul. 13, 2018 (KR) .......................... 10-2018-0081758

(51) Int. Cl.
*H05K 1/18* (2006.01)
*H05K 5/00* (2006.01)
(Continued)

(52) U.S. Cl.
CPC ......... *H05K 5/0069* (2013.01); *G06K 7/0047* (2013.01); *H05K 1/144* (2013.01);
(Continued)

(58) Field of Classification Search
CPC ............... H01L 25/043; H01L 25/0657; H01L 25/0756; H01L 25/117; H01L 21/8829;
(Continued)

(56) References Cited

U.S. PATENT DOCUMENTS 6,376,904 B1 4/2002 Haba et al.
7,185,426 B1 * 3/2007 Hiner ....................... H01L 24/73
29/841

(Continued)

FOREIGN PATENT DOCUMENTS

JP 2004-172157 A 6/2004

*Primary Examiner* — Hoa C Nguyen
(74) *Attorney, Agent, or Firm* — Harness, Dickey & Pierce, P.L.C.

(57) ABSTRACT

A memory card comprising a first main surface and a second main surface opposing each other, and including a printed circuit board (PCB) constituting the first main surface, the PCB including a plurality of first external connection terminals, the plurality of first external connection terminals exposed on the first main surface, a plurality of memory devices stacked on the PCB, a memory controller configured to control the plurality of memory devices, a molding layer encapsulating the plurality of memory devices and the memory controller, the molding layer constituting the second main surface, and one or more second external connection terminals electrically connected to the memory controller, the one or more second external connection terminals embedded in the molding layer and exposed by the molding layer on the second main surface may be provided.

19 Claims, 17 Drawing Sheets

(51) Int. Cl.
*G06K 7/00* (2006.01)
*H05K 3/42* (2006.01)
*H05K 3/40* (2006.01)
*H05K 1/14* (2006.01)

(52) U.S. Cl.
CPC ........... *H05K 1/181* (2013.01); *H05K 3/4007* (2013.01); *H05K 3/425* (2013.01); *H05K 2201/10159* (2013.01); *H05K 2201/10515* (2013.01)

(58) Field of Classification Search
CPC ........... H01L 21/82393; H01L 21/8221; H01L 23/4012; G06K 19/077; H05K 2201/10159; H05K 2201/10515; H05K 1/144; H05K 7/023; H05K 7/1422; H05K 7/1424; H05K 1/181
See application file for complete search history.

(56) References Cited

U.S. PATENT DOCUMENTS

| | | | |
|---|---|---|---|
| 8,053,881 | B2 | 11/2011 | Kim et al. |
| 8,059,421 | B2 | 11/2011 | Park |
| 8,765,525 | B2 | 7/2014 | Yoon et al. |
| 9,377,825 | B2 | 6/2016 | Shinohara et al. |
| 9,514,832 | B2 | 12/2016 | Cao et al. |
| 2008/0049392 | A1 | 2/2008 | Takiar |
| 2008/0156884 | A1 | 7/2008 | Choi et al. |
| 2009/0206461 | A1* | 8/2009 | Yoon .................... H01L 23/3128 257/737 |
| 2009/0290274 | A1 | 11/2009 | Suenaga et al. |
| 2010/0072593 | A1 | 3/2010 | Kim et al. |
| 2015/0200187 | A1 | 7/2015 | Park et al. |
| 2015/0319843 | A1 | 11/2015 | Lim et al. |
| 2017/0278833 | A1 | 9/2017 | Park et al. |
| 2018/0005974 | A1 | 1/2018 | Chiu et al. |

* cited by examiner

MEMORY CARD AND MEMORY CARD SOCKET

CROSS-REFERENCE TO RELATED APPLICATION

This application is a continuation of U.S. application Ser. No. 16/504,548, filed on Jul. 8, 2019, which claims priority under 35 U.S.C. § 119 to Korean Patent Application No. 10-2018-0081758, filed on Jul. 13, 2018, in the Korean Intellectual Property Office, the disclosure of each of which is incorporated herein in its entirety by reference.

BACKGROUND

The inventive concepts relate to memory cards and/or memory card sockets, and more particularly, to memory cards operating at a high speed and having improved reliability and stability, and/or to memory card sockets accommodating the same.

Memory cards have become useful devices for conveniently storing and moving a large amount of information. There is a need for memory cards which not only perform high-speed input/output operations of processing a large amount of information, but also provide improved stability and reliability without errors in input/output operations of processing data. Further, manufacturing methods capable of easily and stably manufacturing such memory cards is desired.

SUMMARY

The inventive concepts provide memory cards having improved reliability and stability while operating at a high speed.

The inventive concepts provide memory card sockets capable of accommodating the memory card.

The inventive concepts provide electronic systems including the memory card socket.

According to an example embodiment of the inventive concepts, a memory card comprising a first main surface and a second main surface opposing each other includes a printed circuit board (PCB) establishing the first main surface, the PCB including a plurality of first external connection terminals, the plurality of first external connection terminals exposed on the first main surface, a plurality of memory devices stacked on the PCB, a memory controller configured to control the plurality of memory devices, a molding layer encapsulating the plurality of memory devices and the memory controller, the molding layer establishing the second main surface, and one or more second external connection terminals electrically connected to the memory controller, the one or more second external connection terminals embedded in the molding layer and exposed by the molding layer at the second main surface.

According to an example embodiment of the inventive concepts, a memory card includes a printed circuit board (PCB) including a plurality of first external connection terminals, the plurality of first external connection terminals configured to be connected to an external device, a plurality of memory devices stacked on the PCB, a memory controller on an uppermost memory device among the plurality of memory devices, an interposer on the uppermost memory device, one or more second external connection terminals on the interposer, the one or more second external connection terminals configured to be connected to the external device, and a molding layer encapsulating the plurality of memory devices and the memory controller.

According to an example embodiment of the inventive concepts, a memory card socket configured to accommodate a memory card that including a first main surface and a second main surface opposing each other includes first external connection terminals configured to contact the first main surface, the first external connection terminals including at least one power supply terminal from among power supply terminals configured to provide power supply in a range between about 3.3V and about 1.8V, second external connection terminals configured to contact the second main surface, the second external connection terminals including one or more of (i) a power supply terminal of about 1.2 V or less, (ii) a pair of data input/output terminals, or (iii) a set of data input/output terminals having a one-lane structure in which a set of data input terminals and a set of data output terminals each comprise a differential signal pair, and a housing configured to accommodate the first external connection terminals and the second external connection terminals, the housing configured to accommodate the memory card According to an example embodiment of the inventive concepts, an electronic system includes a controller, an input/output device configured to input or output data, a memory device configured to store data, the memory device including the aforementioned memory card socket, an interface configured to transmit data to an external device, and a bus configured to connect the controller, the input/output device, the memory device, and the interface for communications therebetween.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

While the term "same" is used in description of example embodiments, it should be understood that some imprecisions may exist. Thus, when one element is referred to as being the same as another element, it should be understood that the one element is the same as another element within a desired manufacturing tolerance range (e.g., ±10%).

When the terms "about," "approximately," or "substantially" are used in this specification in connection with a numerical value, it is intended that the associated numerical value include a manufacturing tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure.

Hereinafter, some example embodiments of the inventive concepts will be described in detail with reference to the accompanying drawings.

Figure 1A:
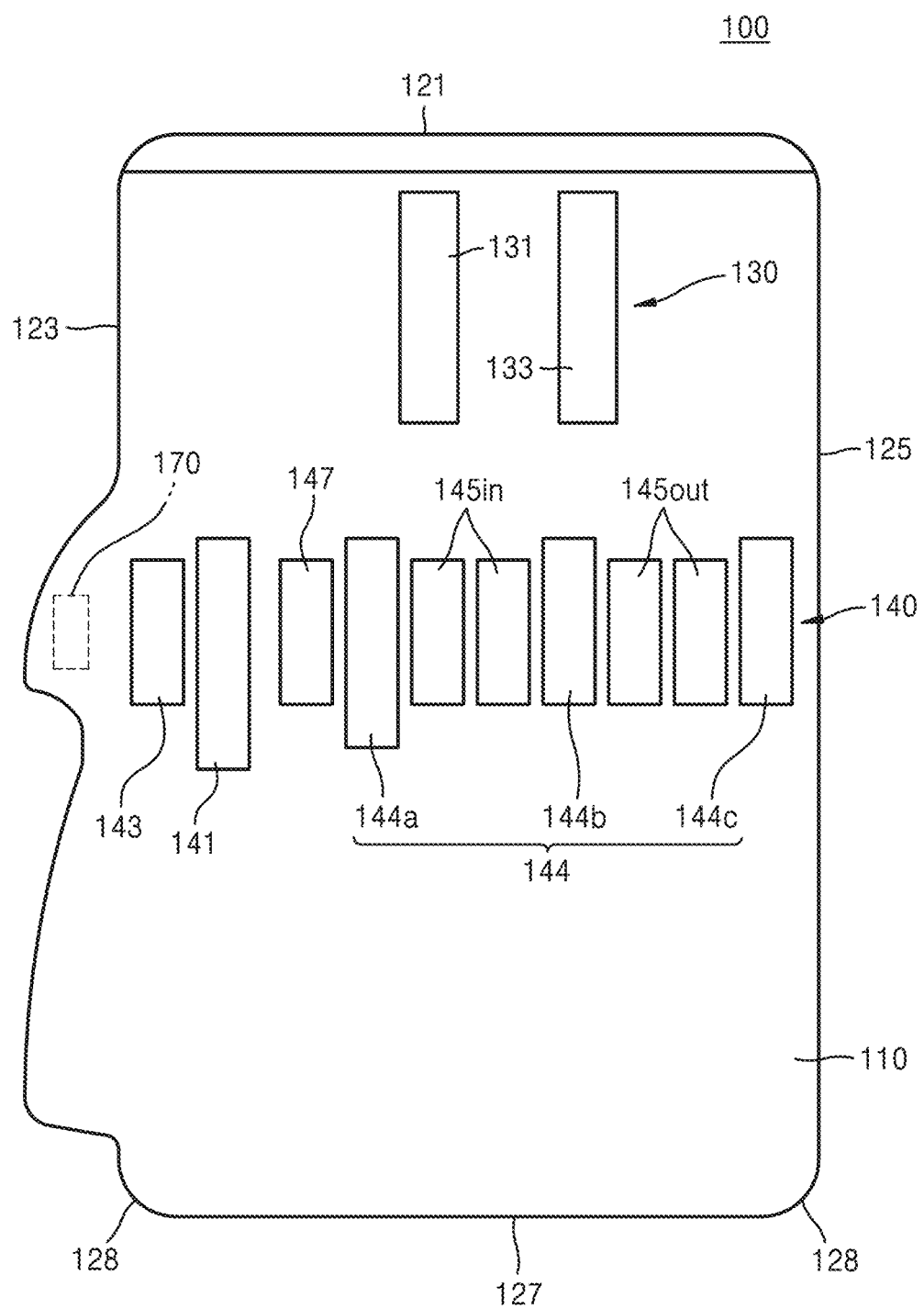
FIG. 1A is a plan view illustrating a first main surface of a memory card according to an example embodiment.
Figure 1B:
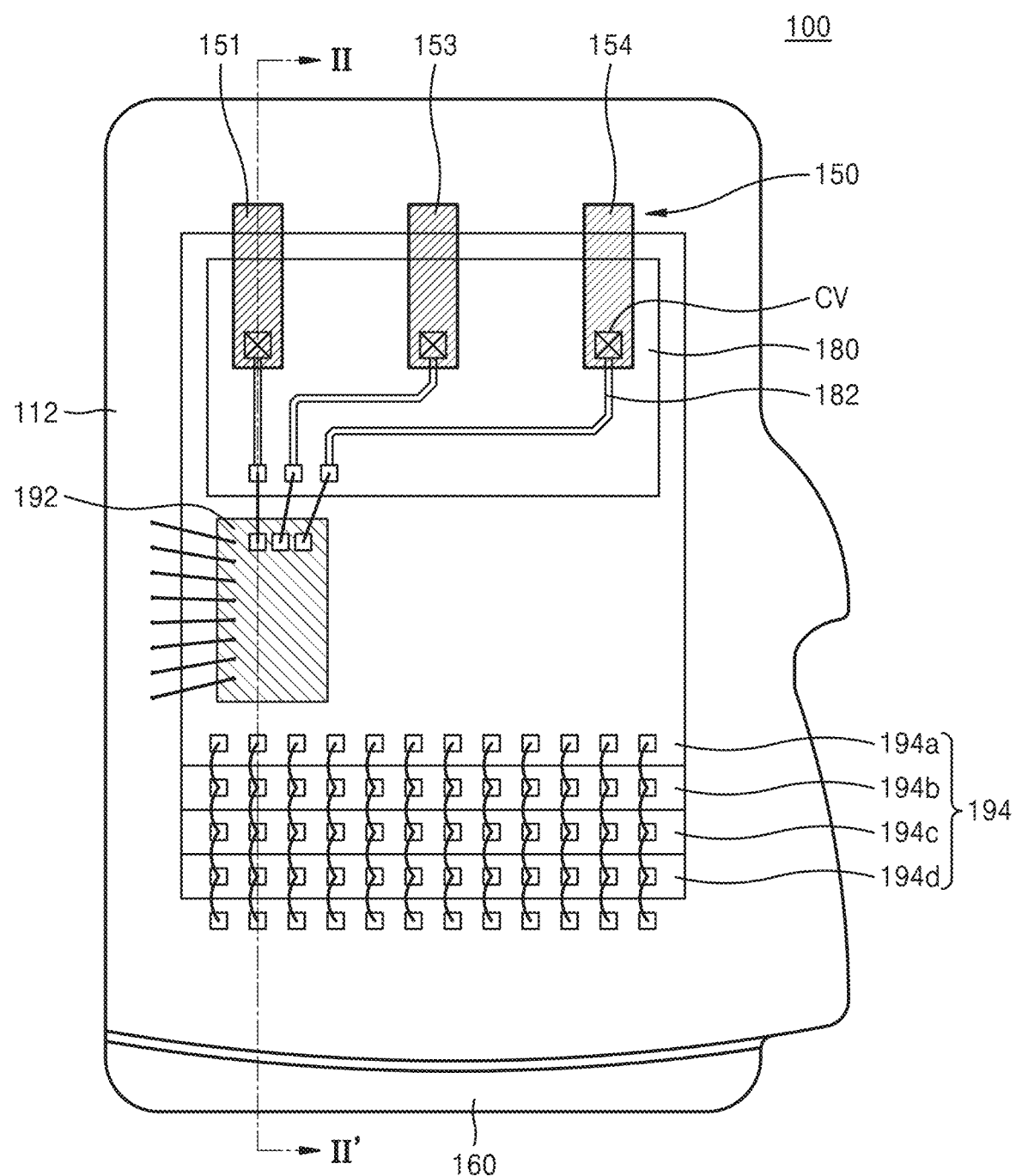
FIG. 1B is a plan view illustrating a second main surface of a memory card according to an example embodiment.
Figure 2:
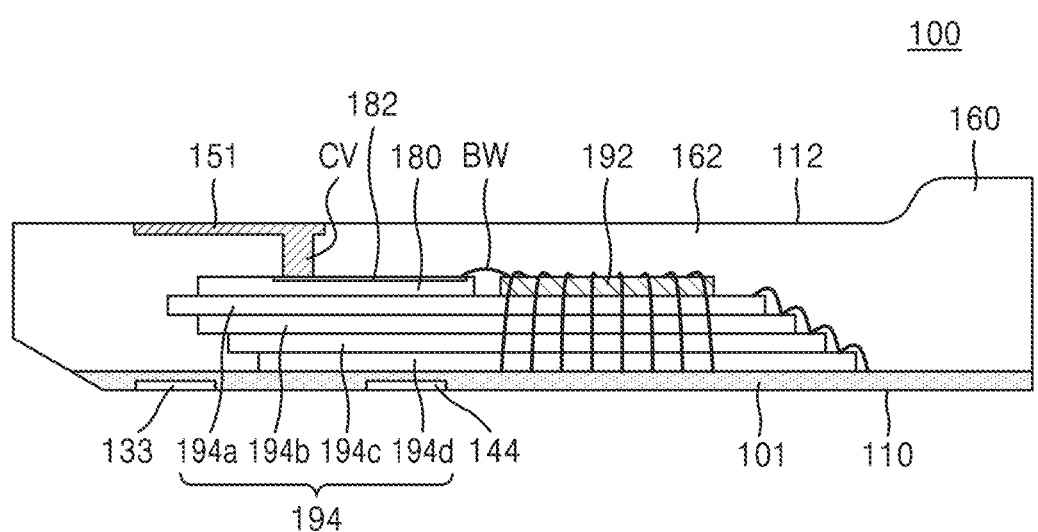
FIG. 2 is a cross-sectional view illustrating a cross-section taken along line II-IT in FIG. 1B.

FIG. 1A is a plan view illustrating a first main surface 110 of a memory card 100 according to an example embodiment. FIG. 1B is a plan view illustrating a second main surface 112 of the memory card 100 according to an example embodiment. FIG. 2 is a cross-sectional view illustrating a section taken along the line II-II' in FIG. 1B.

Referring to FIGS. 1A, 1B, and 2, the memory card 100 may include the first main surface 110 and the second main surface 112 opposing each other. Here, a 'main surface' may denote each of two opposing surfaces extending to have the largest area among respective surfaces of the memory card 100.

The first main surface 110 may be one main surface of a substrate 101 (e.g., a printed circuit board (PCB)). On the substrate 101, a plurality of memory devices 194 and a memory controller 192 configured to control the plurality of memory devices 194 may be provided. Further, first external connection terminals (which include a first row terminal (or first row terminals) 130 and a second row terminal (or second row terminals) 140) may be provided on (while being exposed outwardly at) the first main surface 110.

The second main surface 112 may be defined by a molding layer 162 surrounding the memory controller 192 and the plurality of memory devices 194. Second external connection terminals 150 connectable to external devices may be provided on (while being exposed outwardly at) the second main surface 112.

The plurality of memory devices 194 may include, for example, NAND flash memory devices. The plurality of memory devices 194 may be stacked to be offset from each other in any one direction. In the present example embodiment, the plurality of memory devices 194 are illustrated to include four memory devices (e.g., a first memory device 194a, a second memory device 194b, a third memory device 194c, and a fourth memory device 194d). However, the inventive concepts are not limited thereto.

The memory controller 192 may be provided on the first memory device 194a, which is an uppermost one of the plurality of memory devices 194. The memory controller 192 may be configured to control the memory devices 194. The memory controller 192 may be electrically connected to the first external connection terminals (130 and 140) exposed outwardly at the first main surface. Further, the memory controller 192 may be electrically connected to the second external connection terminal 150 exposed outwardly at the second main surface 112. In some example embodiments, the memory controller 192 may be electrically connected to the substrate 101 via bonding wires, and further electrically connected to the first external connection terminals (130 and 140) via wirings (not shown) provided in the substrate 101.

In some example embodiments, an interposer 180 may be provided on the first memory device 194a, which is the uppermost one of the plurality of memory devices 194. The interposer 180 may be provided in a lateral direction with respect to the memory controller 192. In other words, the interposer 180 may be spaced apart from the memory controller 192 in a lateral direction. In some example embodiments, the interposer 180 may be attached directly onto the first memory device 194a. In some embodiments, the memory controller 192 may be attached directly onto the first memory device 194a. The interposer 180 and the memory controller 192 may be attached directly onto the first memory device 194a by using, for example, a die attach film (DAF), an adhesive, or a non-conductive film (NCF).

The interposer 180 may include an interposer substrate and a conductor line 182 and interposer terminals (not shown) provided thereon. The interposer substrate may include an insulator substrate (e.g., a silicon substrate or a glass substrate). The conductor line 182 may include a wire of gold (Au), aluminum (Al), and/or copper (Cu), and may include an embossed or damascened wire.

The second external connection terminals 150 may be electrically connected to the conductor line 182 on the interposer 180 via a conductor via CV. The conductor via CV may include one of copper (Cu), tungsten (W), titanium (Ti), tantalum (Ta), tin (Sn), Au, Al, nickel (Ni), cobalt (Co), or an alloy thereof. In some example embodiments, the conductor via CV may be formed integrally with the second external connection terminal 150. In some example embodiments, there may be an interface between the conductor via CV and the second external connection terminal 150.

In some example embodiments, the conductor via CV may extend in a direction substantially perpendicular (e.g., vertical) to the first main surface 110 and/or the second main surface 112.

Side surfaces of the second external connection terminals 150 may be surrounded by the molding layer 162. Top surfaces of the second external connection terminals 150 may be at least partially exposed by the molding layer 162. Portions of bottom surfaces of the second external connection terminals 150 that are not in contact with the conductor via CV may be covered by the molding layer 162.

In FIG. 1B, the second external connection terminals 150 are illustrated to include three terminals 151, 153, and 154, but the inventive concepts are not limited thereto. The second external connection terminal 150 may include one or two terminals, or four or more terminals.

In some embodiments, the second external connection terminals 150 may include a power supply terminal having a voltage of about 1.2 V or less (e.g., a voltage of about 1.2 V or a voltage of about 0.4 V) as a supply voltage. In some example embodiments, the second external connection terminals 150 may include a ground terminal. In some example embodiments, the second external connection terminals 150 may include at least a pair of data input/output terminals.

The memory controller 192 may be electrically connected to the conductor line 182 on the interposer 180 via a bonding wire BW. In other words, the memory controller 192 may be electrically connected to the second external connection terminal 150 via the conductor line 182 provided on the interposer 180.

The conductor line 182 on a top surface of the interposer 180 may not be electrically connected to active elements such as semiconductor devices (including, but not limited to, transistors, diodes, and operational amplifiers), and inactive elements (including, but not limited to, resistors, inductors, and capacitors), all of which are provided in the first memory device 194a. Accordingly, the conductor line 182 may not be directly related to an operation of the first memory device 194a, and may be directly related to signal transceiving and/or power supply between the memory controller 192 and the second external connection terminal 150.

The memory card 100 may have two pairs of opposing edges (or alternatively, sides). The two pairs of opposing edges may include an insertion side edge 121 in a direction in which the memory card 100 is inserted into a memory card socket, a second edge 127 opposing the insertion side edge 121. The insertion side edge 121 and the third edge 127 may be parallel to each other. The memory card 100 also includes a second edge 123 connecting an end of the insertion side edge 121 and an end of the second edge 127 and a third edge 125 connecting an opposite second end of the insertion side edge 121 and an opposite end of the second edge 127.

The third edge 125 may extend in a direction substantially perpendicular (e.g., vertical) to a direction in which the insertion side edge 121 extends. In the present example embodiment, the third edge 125 is illustrated to extend only in one direction, and the first edge 123 is illustrated to include both a portion parallel to the third edge 125 and a portion not parallel to the third edge 125.

Between each of the edges (121, 123, 125, and 127), there may be one or more corners 128 having a certain radius of curvature. In some example embodiments, the edges (121, 123, 125, and 127) may have the same radius of curvature.

The insertion side edge 121 may be an edge of the memory card socket into which the memory card 100 is inserted. When the memory card 100 is inserted into the memory card socket, the insertion side edge 121 may be inserted first among the edges (121, 123, 135, and 127), and when the memory card 100 is released from the memory card socket, the insertion side edge 121 may be released last among the edges (121, 123, 135, and 127). A width of the insertion side edge 121 may be determined in consideration of a certain clearance space such that the memory card 100 smoothly enters the memory card socket.

Terminals may be arranged adjacent to the insertion side edge 121 for electrically connecting the semiconductor devices in the memory card 100 to a host. The host may be, for example, a mobile phone, a desktop computer, a notebook computer, a tablet personal computer (PC), a game machine, a navigation device, and a digital camera, but the inventive concepts are not limited thereto. In some example embodiments, an adapter for interfacing may be arranged between the memory card 100 and the host.

The first external connection terminals (130 and 140) may be arranged in two rows on the first main surface 110 as illustrated in FIG. 1A. In other words, a plurality of first row terminals 130 and a plurality of second row terminals 140 may be arranged adjacent to the insertion side edge 121 of the substrate 101.

The first row terminals 130 may include the power supply terminal 131 configured to provide a first voltage as a supply voltage, and the first voltage may have a value between about 3.0 V and about 3.5 V (e.g., about 3.3 V). The first voltage may be supplied to the semiconductor devices operating at a relatively low speed among the semiconductor devices in the memory card 100. For example, the first voltage may be supplied to the memory devices 194 in the memory card 100. The memory devices 194 may be non-volatile memory devices.

The second row terminals 140 may include a power supply terminal 141 configured to provide a second voltage as a supply voltage, and the second voltage may have a value between about 1.5 V and about 2.2 V (e.g., about 1.8 V). The second voltage may be supplied to the semiconductor devices operating at a relatively high speed among the semiconductor devices in the memory card 100. For example, the second voltage may be supplied to the memory controller 192 in the memory card 100.

The first row terminals 130 may be arranged closer to the insertion side edge 121 compared with the second row terminals 140. In other words, the second row terminals 140 may be arranged farther apart from the insertion side edge 121 compared with the first row terminals 130.

In FIG. 1A, two of the first row terminals 130 and ten of the second row terminals 140 are illustrated, but the numbers, positions, shapes, and sizes of the first and second row terminals 130 and 140 are not limited thereto. In some example embodiments, some terminals of the first and second row terminals 130 and 140 may be covered by a solder resist (SR) layer, and thus may not be exposed to the outside. The unexposed some terminals may be, for example, test terminals.

The first row terminals 130 and the second row terminals 140 each may include one or more ground terminals. For example, the first row terminals 130 may include a ground terminal 133. Further, the second row terminals 140 may include ground terminals 144.

The second row terminals 140 may include a pair of data input terminals 145*in* and a pair of data output terminals 145*out*. Although the data input terminals 145*in* are illustrated to be arranged closer to the center of the memory card 100 compared with the pair of data output terminals 145*out* in FIG. 1A, arrangements thereof may be changed.

The pair of data input terminals 145*in* may constitute a pair of differential signals, and the pair of data output terminals 145*out* may also constitute a pair of differential signals. The pair of data input terminals 145*in* and the pair of data output terminals 145*out* using the pair of differential signals may be relatively insensitive to noise or interference, thereby enabling stable transmission of high-speed data. The pair of data input terminals 145*in* and the pair of data output terminals 145*out* may constitute data input/output terminals of a one-lane structure.

The data input terminals 145*in* may be electrically shielded by a pair of ground terminals 144*a* and 144*b*. Further, the data output terminals 145*out* may be electrically shielded by a pair of ground terminals 144*b* and 144*c*. The pair of data input terminals 145*in* and the pair of data output terminals 145*out* may more reliably input and output data due to the shields, respectively.

The pair of data input terminals 145*in* may have the same dimension. Further, the pair of data output terminals 145*out* may have the same dimension. Further, the data input terminals 145*in* and the data output terminals 145*out* may have the same dimension.

The second row terminals 140 may further include a card detection terminal 143 and a reference clock terminal 147.

The first external connection terminals (130 and 140) may include an external connection terminal according to one standard of a secure digital (SD) card, a micro SD card, a mini SD card, a universal flash storage (UFS) card, or a multimedia card (MMC).

In a side direction of the second row terminals 140, a lateral protrusion that looks like a shark's fin may be provided. A passive element 170 may be provided in the lateral protrusion. The passive element 170 may include one or more of a resistor, a capacitor, an inductor, a thermistor, an oscillator, a ferrite bead, an antenna, a varistor, and/or a crystal. However, example embodiments of the present inventive concepts are not limited thereto. According to some example embodiments, the lateral protrusion may include any other passive element(s).

The memory card 100 may further include a withdrawal assisting portion 160 at the second main surface 112. The withdrawal assisting portion 160 may allow easy withdrawal of the memory card 100 from a memory card socket after the memory card 100 has been inserted into the socket. The withdrawal assisting portion 160 may be protruded from the second main surface 112 of the memory card 100. Further, the withdrawal assisting portion 160 may be formed adjacent to the second edge 127.

Figure 3A:
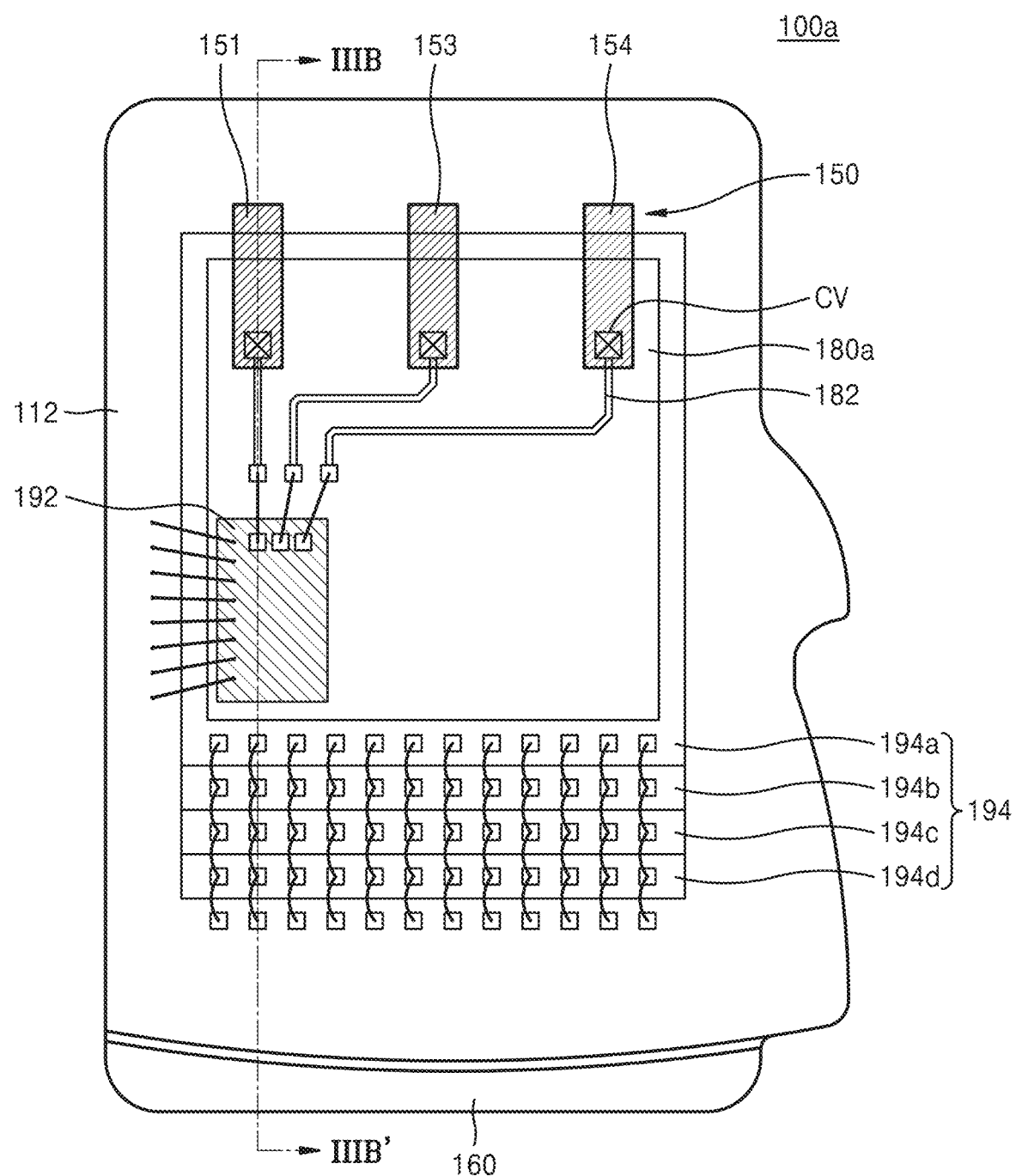
FIG. 3A is a plan view illustrating a second main surface of a memory card according to an example embodiment.
Figure 3B:
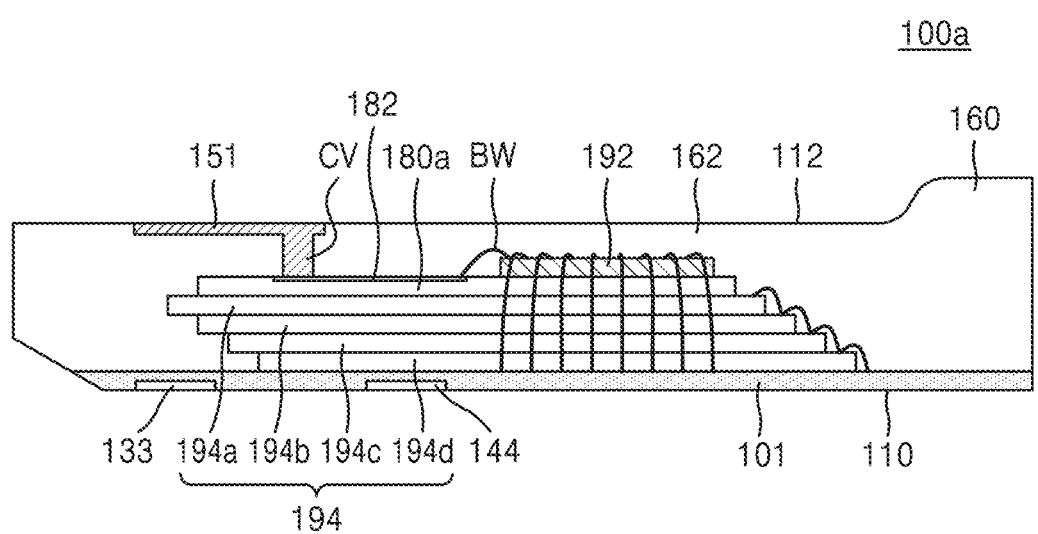
FIG. 3B is a cross-sectional view illustrating a cross-section taken along line IIIB-IIIB' in FIG. 3A.

FIG. 3A is a plan view illustrating the second main surface 112 of a memory card 100*a* according to an example embodiment. FIG. 3B is a cross-sectional view illustrating a section taken along the line IIIB-IIIB' in FIG. 3A.

The embodiment illustrated in FIGS. 3A and 3B differs from the example embodiment illustrated in FIGS. 1A and 2 in that the memory controller 192 is arranged on the interposer 180*a*. Thus, duplicate descriptions are omitted and the following descriptions focus on differences.

Referring to FIGS. 3A and 3B, the interposer 180*a* may be arranged directly on the first memory device 194*a*. In some example embodiments, the interposer 180*a* may be attached directly onto the first memory device 194*a* by using a die attach film, an adhesive, or a nonconductive film.

Further, the memory controller 192 may be arranged directly on the interposer 180*a*. The memory controller 192 may be attached directly onto the interposer 180*a* by using a die attach film, an adhesive, or a nonconductive film. The conductor line 182 may be provided on the interposer 180*a* (e.g., on a portion of a top surface of the interposer 180*a*), and the memory controller 192 may be electrically connected directly to the conductor line 182 via the bonding wire BW. Here, the fact that the conductor line 182 and the memory controller 192 are electrically connected directly to each other may denote that no other electrical element except for an element dedicated to flow current therethrough is arranged between the conductor line 182 and the memory controller 192.

The conductor line 182 may be connected to the conductor via CV, and the conductor via CV may be connected to the second external connection terminal 150. In other words, the memory controller 192 may be connected to the second external connection terminal 150 via the bonding wire BW, the conductor line 182, and the conductor via CV.

The conductor line 182 on the top surface of the interposer 180*a* may not be electrically connected to active elements such as semiconductor devices (including, but not limited to, transistors, diodes, and operational amplifiers), and inactive elements (including, but not limited to, resistors, inductors, and capacitors), all of which are provided in the first memory device 194*a*. Accordingly, the conductor line 182 may not be directly related to an operation of the first memory device 194*a* and may be directly related to signal transceiving and/or power supply between the memory controller 192 and the second external connection terminal 150.

A plane area of the memory controller 192 may be sufficiently less than that of the interposer 180*a*.

Figure 4A:
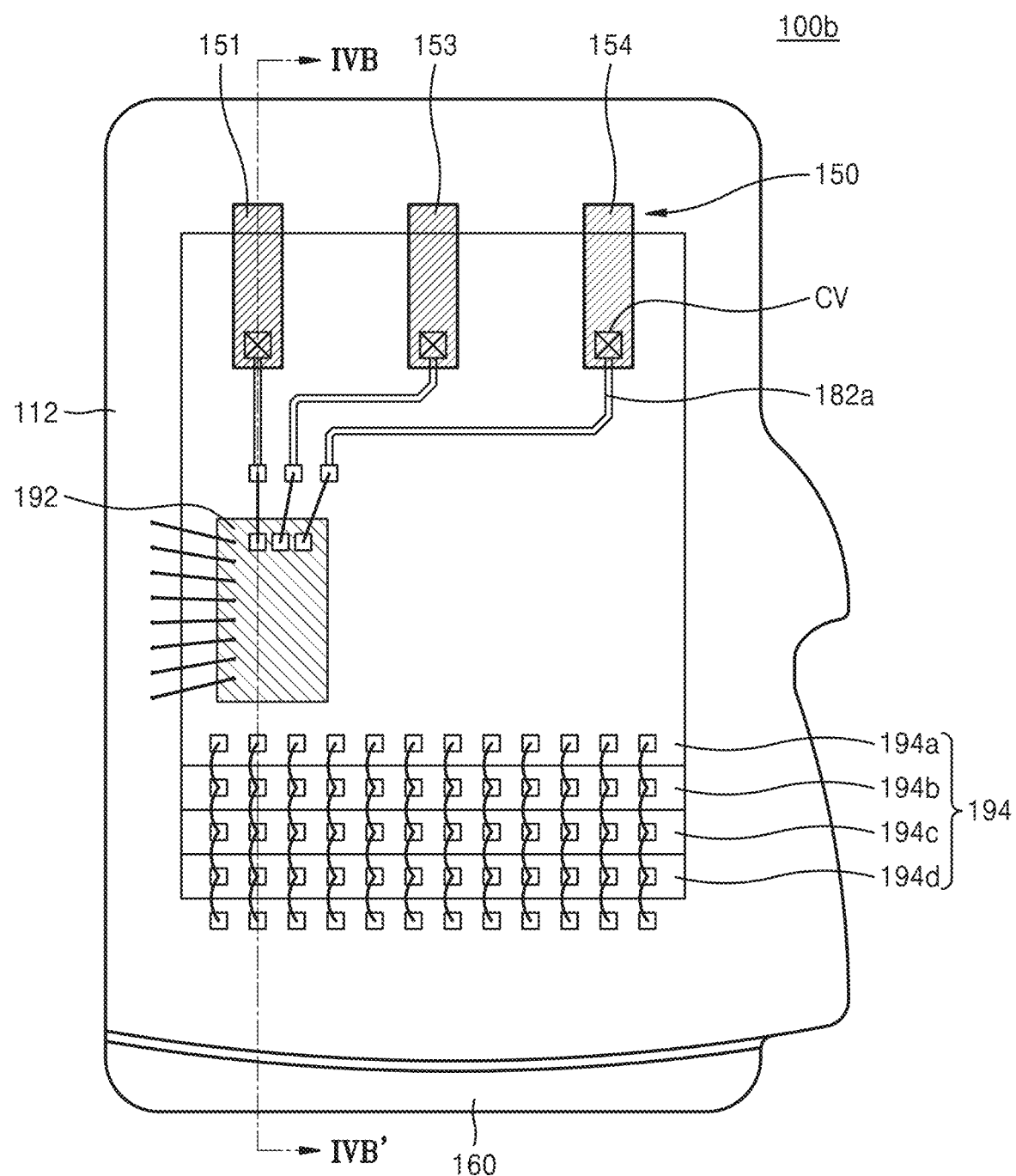
FIG. 4A is a plan view illustrating a second main surface of a memory card according to an example embodiment.
Figure 4B:
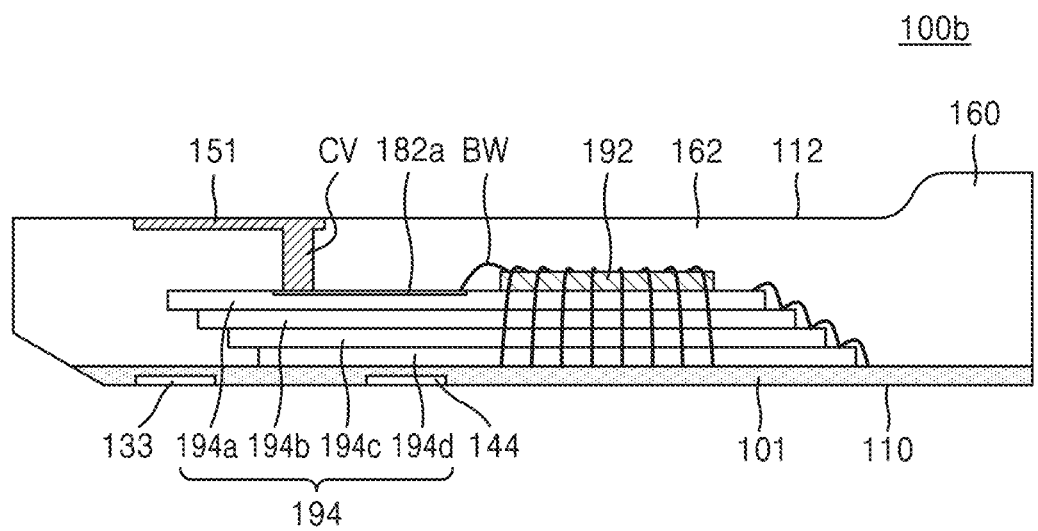
FIG. 4B is a cross-sectional view illustrating a cross-section taken along line IVB-IVB' in FIG. 4A.

FIG. 4A is a plan view illustrating the second main surface 112 of a memory card 100*b* according to an example embodiment. FIG. 4B is a cross-sectional view illustrating a section taken along the line IVB-IVB' in FIG. 4A.

The example embodiment illustrated in FIGS. 4A and 4B differs from the example embodiment illustrated in FIGS. 1A through 2 in that the interposer 180 is omitted. Thus, duplicate descriptions are omitted and the following descriptions focus on differences.

Referring to FIGS. 4A and 4B, a conductor line (or a plurality of conductive lines) 182*a* may be provided on the first memory device 194*a* (e.g., on a top surface of the first memory device 194*a*).

In some example embodiments, the conductor lines 182*a* may be provided on a top surface of each of the first memory device 194*a*, the second memory device 194*b*, the third memory device 194*c*, and the fourth memory device 194*d*. In this case, the conductor lines 182*a* on the top surfaces of the second memory device 194*b*, the third memory device 194*c*, and the fourth memory device 194*d* may be dummy conductor lines which do not participate in the operation of the memory card 100*b*.

The conductor vias CV that are connected to the second external connection terminals 150 (which includes terminals 151, 153, and 154), respectively, may be connected directly to the conductor lines 182*a*, respectively. The conductor vias CV may extend in a direction vertical or substantially perpendicular to the second main surface 112.

One or more of the conductor lines 182*a* may be electrically connected to the memory controller 192 via the bonding wire BW. In other words, the conductor line 182*a* may be electrically and directly connected to the memory controller 192. Here, the fact that the conductor line 182*a* and the memory controller 192 are electrically and directly connected to each other may denote that no other electrical element except for an element dedicated to flow current therethrough is arranged between the conductor line 182*a* and the memory controller 192.

Accordingly, the memory controller 192 may be electrically connected to one or more the second external connection terminals 150 via the bonding wire(s) BW, the conductor line(s) 182*a*, and the conductor via(s) CV.

One or more of the conductor lines 182*a* on a top surface of the first memory device 194*a* may not be electrically connected to active elements such as semiconductor devices (including, but not limited to, transistors, diodes, and operational amplifiers), and inactive elements (including, but not limited to, resistors, inductors, and capacitors), all of which are provided in the first memory device 194*a*. Accordingly, one or more of the conductor line 182*a* may not be directly related to an operation of the first memory device 194*a*, and may be directly related to signal transceiving and/or power supply between the memory controller 192 and the second external connection terminal 150.

The top surface of the first memory device 194*a* may be passivated, and the conductor line(s) 182*a* may be provided in or on a passivation layer.

Figure 5:
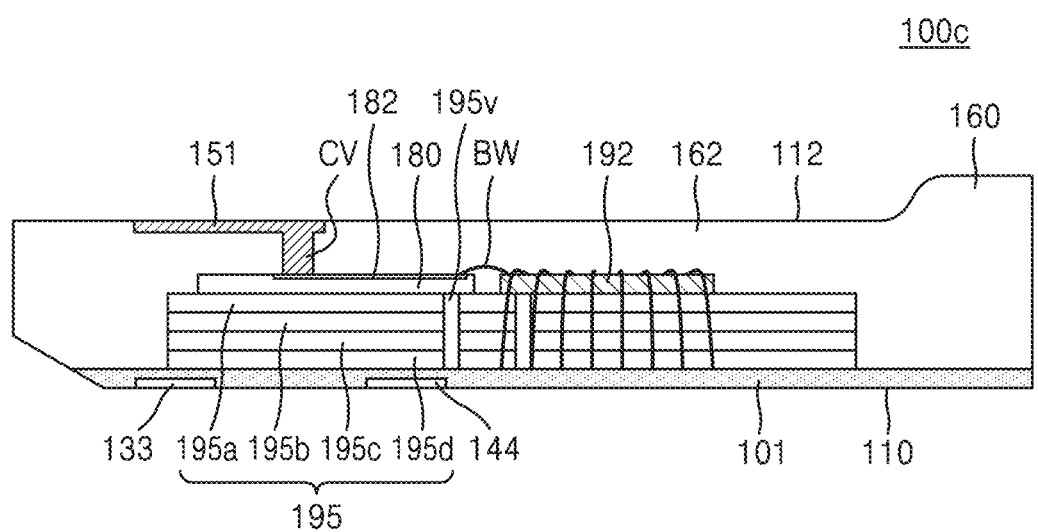
FIG. 5 is a cross-sectional view illustrating a memory card according to an example embodiment.

FIG. 5 is a cross-sectional view illustrating a memory card 100*c* according to an example embodiment.

The memory card 100*c* of FIG. 5 may be different from the memory cards 100, 100*a*, or 100*b* of FIGS. 1A-4B in that, instead of a plurality of memory devices 194 being offset to each other and being interconnected to each other via the bonding wires BW, a plurality of memory devices 195 may be laminated without forming an offset to each other. Thus, duplicate descriptions are omitted and the following descriptions focus on differences.

Referring to FIG. 5, the plurality of memory devices 195 may include a first memory device 195*a*, a second memory device 195*b*, a third memory device 195*c*, and a fourth memory device 195*d*. Although this example illustrates the plurality of memory devices 195 to include four memory devices (195*a*, 195*b*, 195*c*, and 195*d*), the inventive concepts are not limited thereto.

The memory controller 192 and the interposer 180 may be provided on the first memory device 195*a*, which is the uppermost one of the plurality of memory devices 195. FIG. 5 illustrates an example in which the interposer 180 is arranged in a lateral direction of the memory controller 192. In other words, FIG. 5 illustrates an example in which the interposer 180 is laterally spaced apart from the memory controller 192. However, it may be understood by those of ordinary skill in the art that it is possible to arrange the memory controller 192 on a top of the interposer 180 on the first memory device 195*a*, as illustrated in FIGS. 3A and 3B.

Figure 6A:
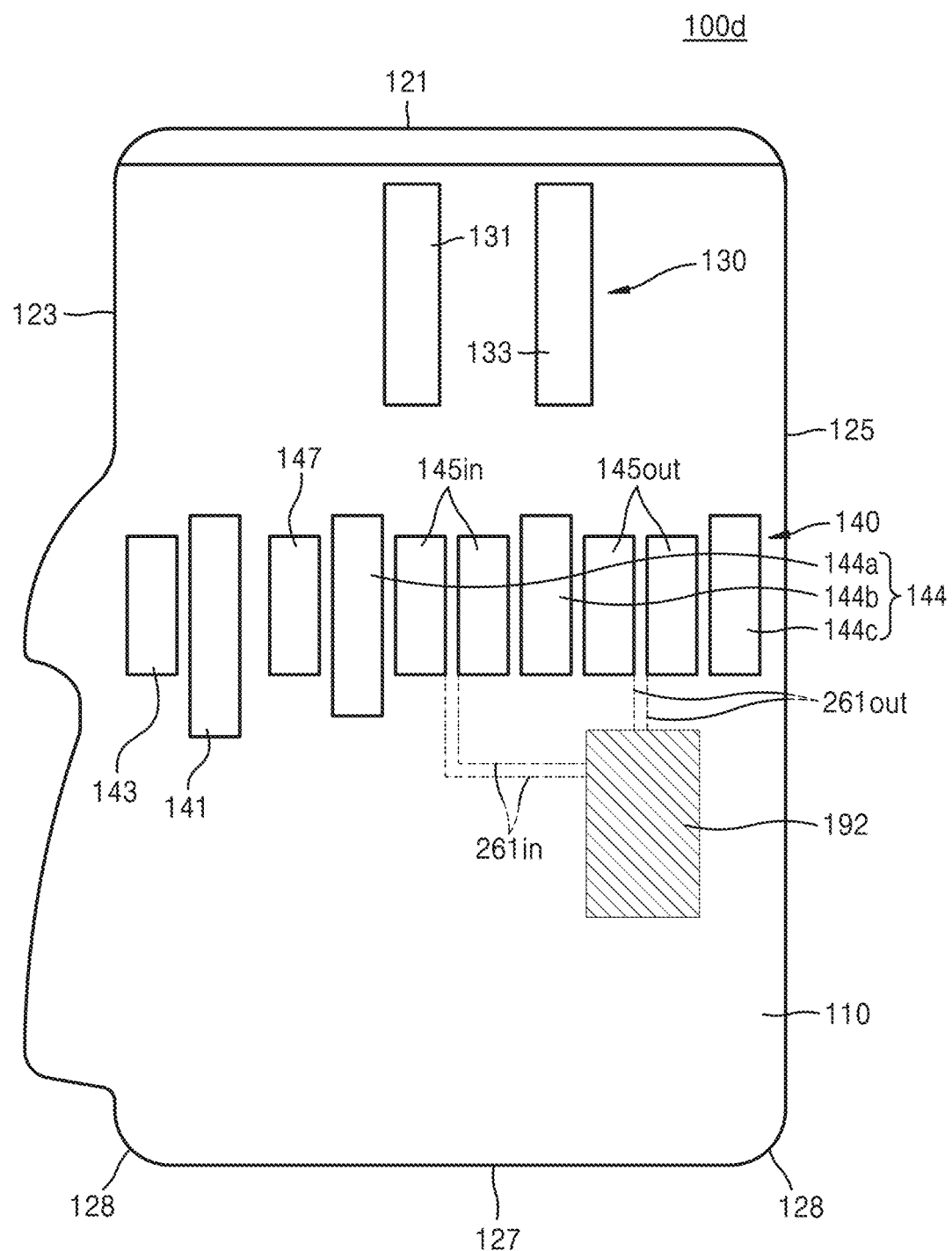
FIGS. 6A and 6B are plan views illustrating a first main surface and a second main surface of a memory card, respectively, according to an example embodiment.
Figure 6B:
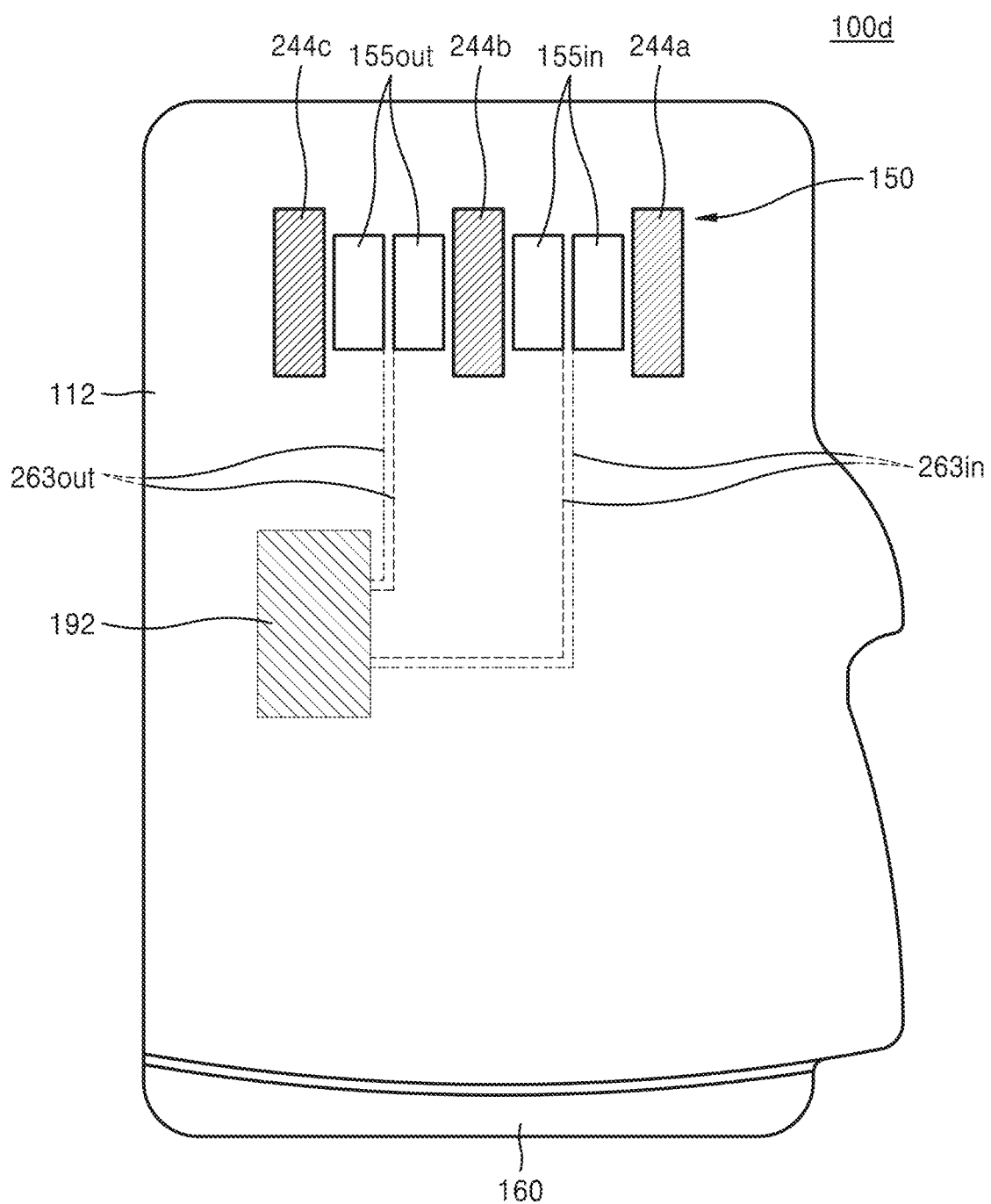

FIGS. 6A and 6B are plan views illustrating the first main surface 110 and the second main surface 112 of a memory card 100*d*, respectively, according to an example embodiment.

Referring to FIGS. 6A and 6B, as described above, the first external connection terminals (130 and 140) provided on the first main surface 110 may include the pair of first data input terminals 145*in* and the pair of first data output terminals 145*out*. The pair of first data input terminals 145*in* and the pair of first data output terminals 145*out* each may constitute a pair of differential signals.

Signals input through the pair of first data input terminals 145*in* may be transmitted to the memory controller 192 via a first signal input path 261*in*. Further, a signal output from the memory controller 192 may be transmitted to the pair of first data output terminals 145*out* via a first signal output path 261*out*. As described above with reference to FIG. 1A, the pair of first data input terminals 145*in* and the pair of first data output terminals 145*out* may constitute the first data input/output terminals of a one-lane structure.

The second external connection terminals 150 provided on the second main surface 112 may include a pair of second data input terminals 155*in* and a pair of second data output terminals 155*out*. Although the pair of second data input terminals 155*in* are illustrated to be arranged to the right side of the pair of second data output terminals 155*out* in FIG. 6B, their positions may be mutually exchanged.

The second data input terminals 155*in* may be electrically shielded by a pair of ground terminals 244*a* and 244*b*. Further, the second data output terminals 155*out* may be electrically shielded by a pair of ground terminals 244*b* and 244*c*. The pair of second data input terminals 155*in* and the pair of second data output terminals 155*out* may more reliably input and output data due to the shields, respectively.

The pair of second data input terminals 155*in* may constitute a pair of differential signals, and the pair of second data output terminals 155*out* may also constitute a pair of differential signals. Signals input through the pair of second data input terminals 155*in* may be transmitted to the memory controller 192 via a second signal input path 263*in*. Further, a signal output from the memory controller 192 may be transmitted to the pair of second data output terminals 155*out* via a second signal output path 263*out*.

The pair of second data input terminals 155*in* and the pair of second data output terminals 155*out* may constitute the second data input/output terminals of a one-lane structure.

Accordingly, the pair of data input terminals 155*in* and the pair of data output terminals 155*out* on the second main surface 112, and the pair of data input terminals 145*in* and the pair of data output terminals 145*out* on the first main surface 110 may constitute a set of data input/output terminals of two-lane structure when viewed in a plan view. Because the number of paths through which data is input/out is doubled, a data input/output speed may be theoretically doubled.

Such an arrangement of terminals (e.g., the second data input/output terminals and ground terminals used for an operation of a memory card) on the second main surface 112 may allow a higher degree of freedom for a design of wire-routing in the substrate 101, and thus, a memory card having higher reliability and stability may be obtained.

Figure 7A:
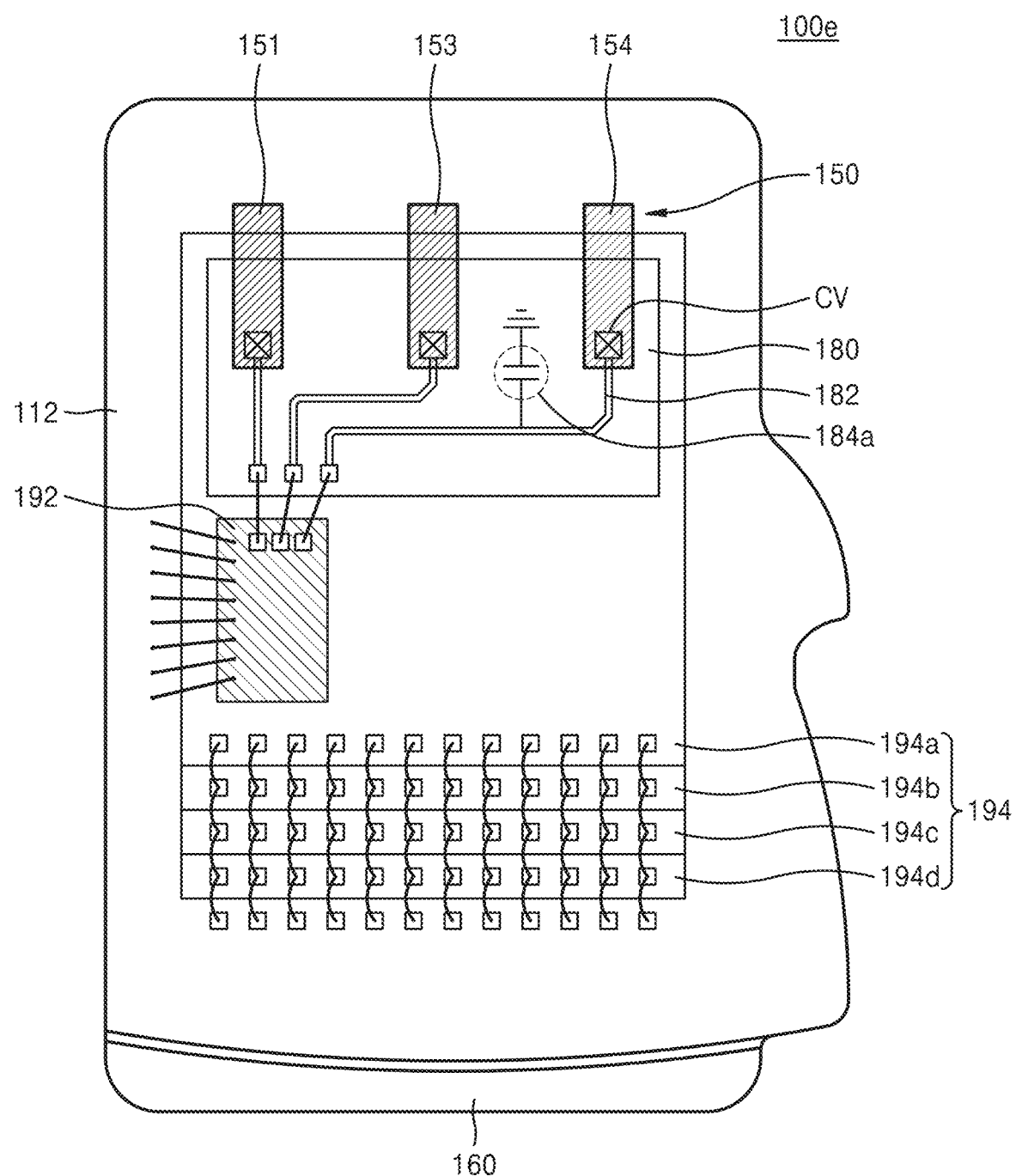
FIGS. 7A and 7B are schematic plan views illustrating second main surfaces of memory cards, respectively, according to some example embodiments.

FIG. 7A is a plan view illustrating the second main surface 112 of a memory card 100*e* according to an example embodiment. FIG. 7A is the same as FIG. 1B except that a capacitor 184*a* is connected to the conductor line 182. Thus, duplicate descriptions are omitted and the following descriptions focus on differences.

Referring to FIG. 7A, the capacitor 184*a* may be further provided on the interposer 180. The capacitor 184*a* may be connected to the conductor line 182 which is connected to any one (e.g., the terminal 154) of the second external connection terminals 150. When the terminal 154 is a power supply terminal (e.g., a terminal supplying a voltage of about 1.2 V, about 0.4 V, or about 0.2 V) as a supply voltage, it may be helpful to improve the electrical characteristics of the memory card 100*e* may be improved by connecting the terminal 154 to a capacitor. The capacitor 184*a* may be mounted on the interposer 180 and may be electrically connected to the terminal 154.

One end of the capacitor 184*a* may be connected to a conductor line 182 that is connected to the terminal 154. Further, the other end of the capacitor 184*a* may be grounded.

The capacitor 184*a* may be a separate element that is mounted on the interposer 180 or may be an element embedded within the interposer 180 formed while embedding the conductor line 182 in the interposer 180.

Figure 7B:
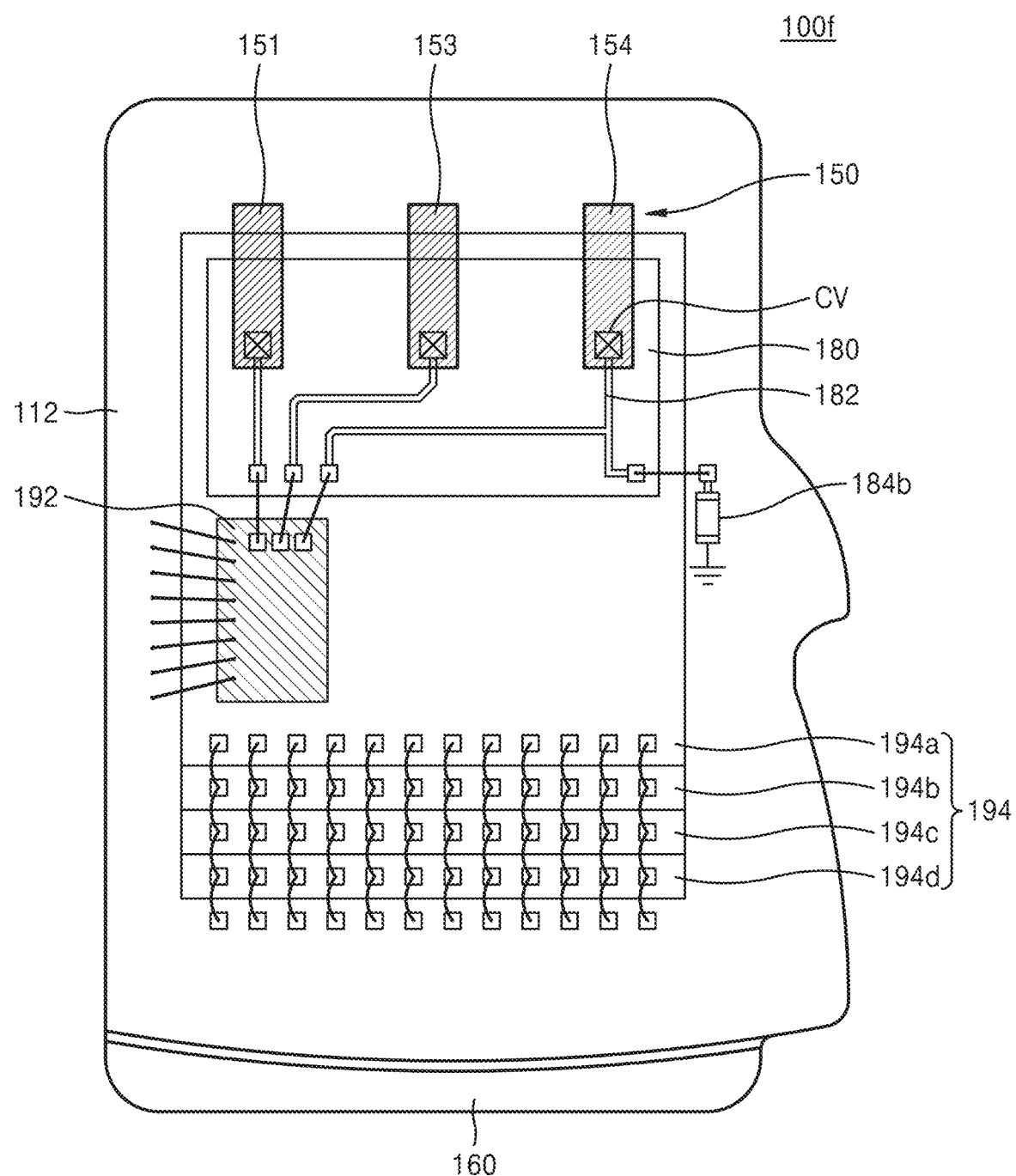

FIG. 7B is a plan view illustrating the second main surface 112 of a memory card 100*f* according to an example embodiment.

The memory card 100*f* of FIG. 7B differs from the memory card 100*e* of FIG. 7A in that a capacitor 184*b* is provided in an area other than the interposer 180. Thus, duplicate descriptions are omitted and the following descriptions focus on differences.

Referring to FIG. 7B, the capacitor 184*b* may be provided at a position outside the interposer 180 (e.g., directly on the substrate 101 (refer to FIG. 2)). In some example embodiments, the capacitor 184*b* may be the passive element 170 as illustrated in FIG. 2.

According to the inventive concepts, memory cards having improved reliability and stability while operating at a relatively high speed and memory card sockets capable of accommodating the memory card may be obtained.

According to the example embodiments, memory cards may include external connection terminals on a first main surface as well as a second main surface. Thus, a degree of freedom of wire-routing of the PCB of the memory card may be improved, and thus, memory cards having improved reliability and stability may be obtained.

Further, the data input/output speed may be improved by providing the second external connection terminals arranged on the second main surface and arranged to have a one-lane arrangement.

Figure 8:
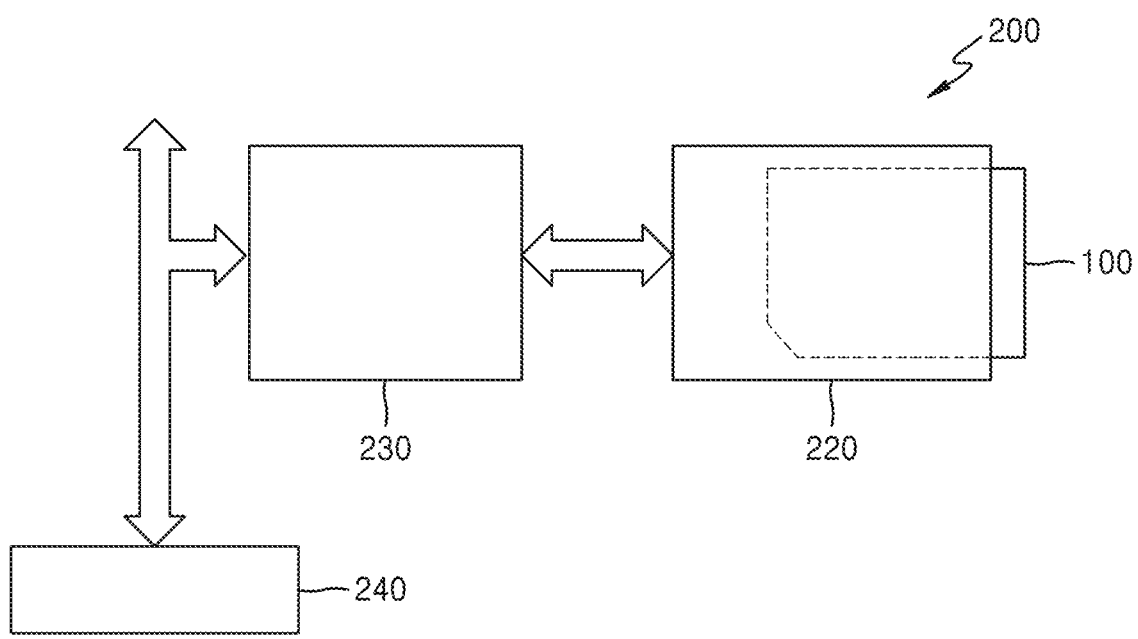
FIG. 8 is a schematic diagram of a system including a memory socket configured to accommodate a memory card, according to an example embodiment.

FIG. 8 is a schematic diagram of a system 200 including a memory socket 220 configured to accommodate the memory card 100 according to an example embodiment.

Referring to FIG. 8, the system 200 may include the memory card socket 220, the memory card 100 described with reference to the above example embodiments, a card interface controller 230, and a host (or an external device) 240. The memory card socket 220 may be configured to accommodate insertion and contact of the memory card 100. The memory card socket 220 may be configured to be electrically connected to, for example, the first external connection terminals (that is, the first row terminals 130 and the second row terminals 140) and the second external connection terminals 150 of the memory cards 100, 100a, 100b, 100c, 100d, 100e, or 100f illustrated in FIGS. 1A through 6B. The card interface controller 230 may control data exchange with the memory card 100 via the memory card socket 220. The card interface controller 230 may also be used to store data in the memory card 100. The host 240 may control the card interface controller 230.

Figure 9A:
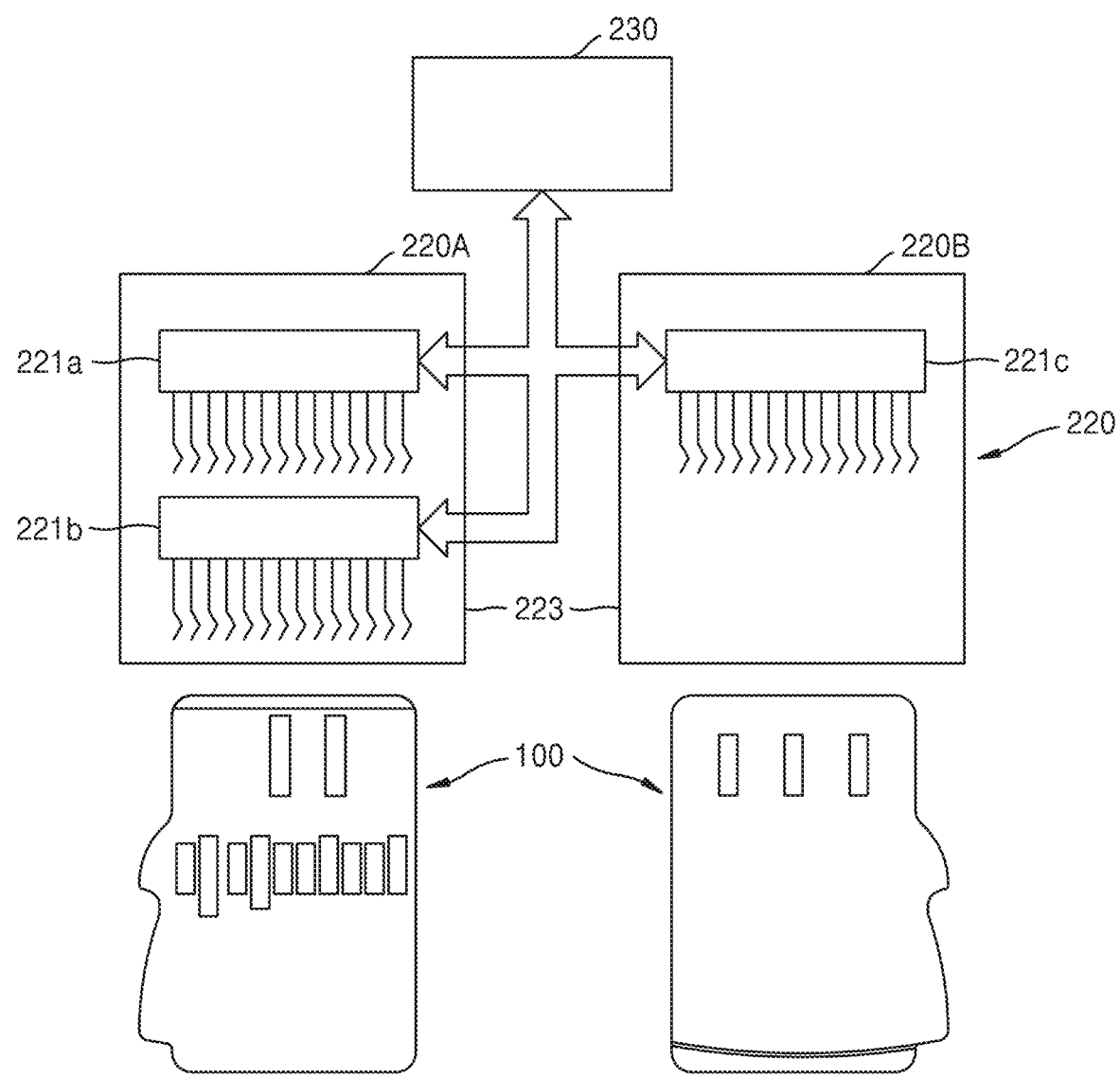
FIG. 9A is a schematic diagram illustrating the memory card socket of FIG. 8 in more detail in consideration of an electrical connection to a memory card.
Figure 9B:
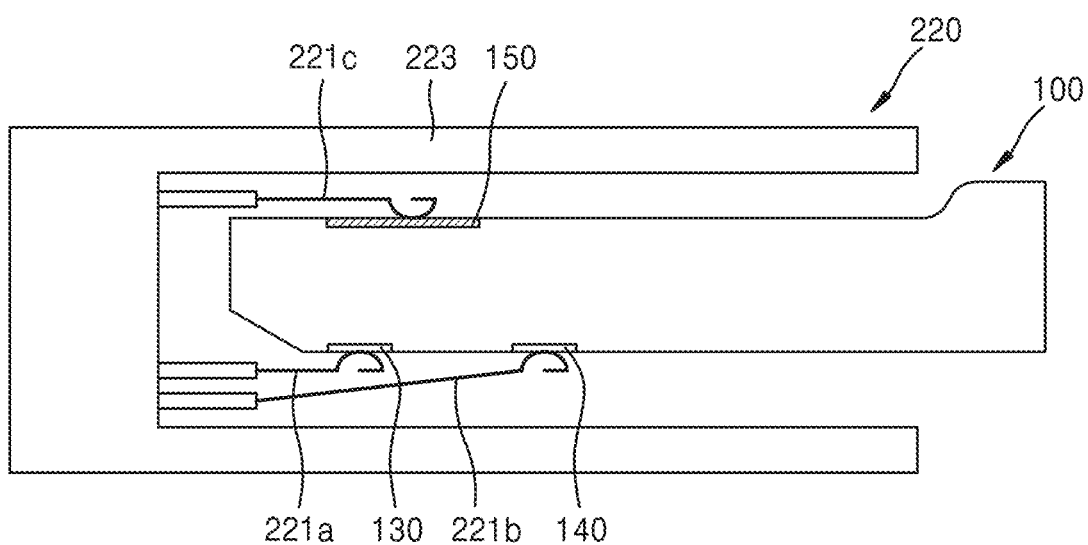
FIG. 9B is a side view schematically illustrating a state in which the memory card socket and the memory card of FIG. 9A are connected to each other.

FIG. 9A is a schematic diagram of the memory card socket 220 in FIG. 8 in more detail in consideration of an electrical connection to the memory card 100. FIG. 9B is a side view schematically illustrating a state in which the memory card socket 220 and the memory card 100 are connected to each other.

Referring to FIGS. 9A and 9B, the memory card socket 220 is configured to accommodate the above-described memory card 100, 100a, 100b, 100c, 100d, 100e, or 100f. A portion indicated by 220A in FIG. 9A may illustrate a bottom portion of the memory card socket 220 and pins which contact a bottom surface of the memory card 100, and a portion indicated by 220B may illustrate a top portion of the memory card socket 220 and pins which contact a top surface of the memory card 100.

The memory card socket 220 may include first row corresponding socket terminals 221a corresponding to the first row terminals 130 of the memory card 100, 100a, 100b, 100c, 100d, 100e, or 100f, second row corresponding socket terminals 221b corresponding to the second row terminals 140 of the memory card 100, 100a, 100b, 100c, 100d, 100e, or 100f, the memory cards 100, 100a, 100b, third row corresponding socket terminals 221c corresponding to the second external connection terminals 150 of the memory card 100, 100a, 100b, 100c, 100d, 100e, or 100f, and a housing capable of accommodating the socket terminals (221a, 221b, and 221c).

The memory card 100, 100a, 100b, 100c, 100d, 100e, or 100f may operate by being inserted into the housing 223 to contact the first row corresponding socket terminals 221a, the second row corresponding socket terminals 221b, and the third row corresponding socket terminals 221c.

As described above with reference to FIG. 8, the memory card socket 220 may be electrically connected to a card interface controller 230 which is configured to control inputting/outputting of power, signals, and/or data to/from the first row corresponding socket terminals 221a, the second row corresponding socket terminals 221b, and the third row corresponding socket terminals 221c.

Among the first row corresponding socket terminals 221a, the second row corresponding socket terminals 221b, and the third row corresponding socket terminals 221c, there may be a socket terminal which is configured to identify the inserted memory card 100, 100a, 100b, 100c, 100d, 100e, or 100f as first-type card when a particular terminal corresponding to the inserted memory cards 100, 100a, 100b, 100c, 100d, 100e, or 100f is a ground terminal, and identify the inserted memory card 100, 100a, 100b, 100c, 100d, 100e, or 100f as second-type card when the particular terminal is not a ground terminal.

Although the first row terminals 130 of the memory card 100, 100a, 100b, 100c, 100d, 100e, or 100f illustrated in the embodiments are two, more than three socket terminals may be provided such that the first row corresponding socket terminals 221a recognize and use the second-type memory cards. In some example embodiments, the number of socket terminals may be greater than the number of the second row terminals 140 and/or the number of the second external connection terminals 150 such that the second row corresponding socket terminals 221b and/or the third row corresponding socket terminals 221c may recognize and use different types of memory cards. It will be understood by those of ordinary skill in the art that the memory card socket according to example embodiments of the inventive concepts are not limited to the numbers of socket terminals illustrated in FIGS. 9A and 9B.

Figure 10:
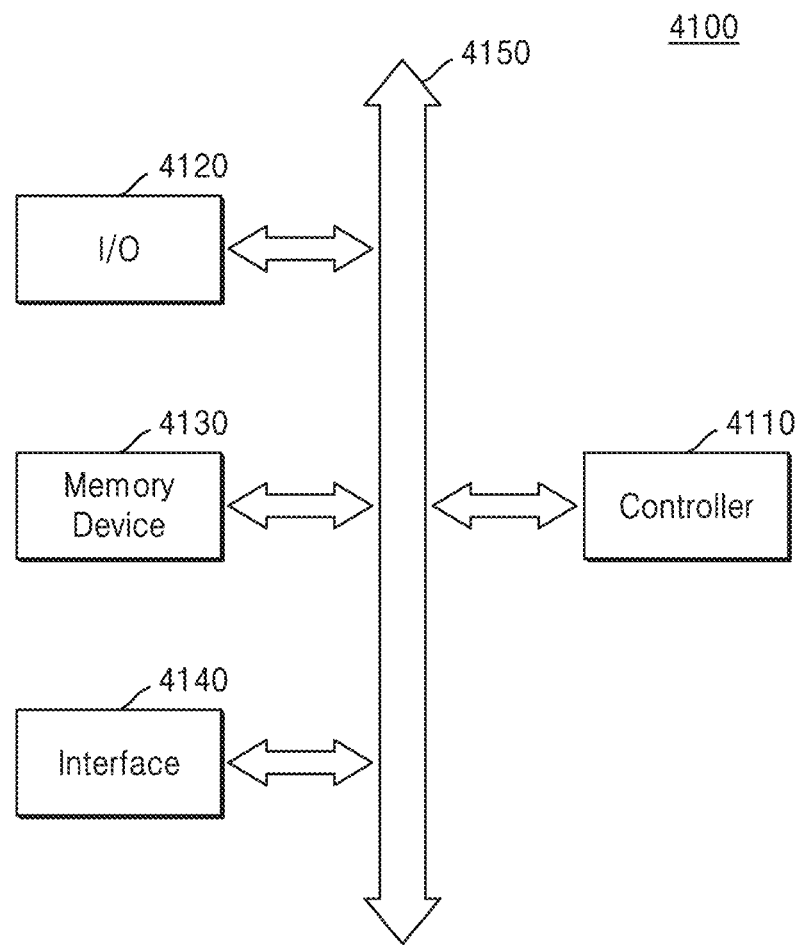
FIG. 10 is a block diagram of an example of an electronic system including a memory card, according to an example embodiment.

FIG. 10 is a block diagram of an example of an electronic system 4100 including a memory card according to an example embodiment of the inventive concepts.

Referring to FIG. 10, the electronic system 4100 according to an example embodiment may include a controller 4110, an input/output (I/O) device 4120, a memory device 4130, an interface 4140, and a bus 4150. The controller 4110, the I/O device 4120, the memory device 4130, and/or the interface 4140 may be connected to each other via the bus 4150. The bus 4150 may correspond to a path through which data is moved.

The controller 4110 may include at least one of a microprocessor, a digital signal process, a microcontroller, and/or logic elements capable of performing similar functions. The I/O device 4120 may include a keypad, a keyboard, a display device, etc. The memory device 4130 may store data and/or commands, etc. The memory device 4130 may include at least one of the memory cards disclosed in the example embodiments described above. The memory device 4130 may include the memory card socket 220 described with reference to FIGS. 8, 9A, and 9B. In addition, the memory device 4130 may further include other types of semiconductor memory devices (for example, nonvolatile memory devices and/or static random-access memory (RAM) (SRAM) devices). The interface 4140 may transmit data to or receive data from a communication network. The interface 4140 may be in a wired or wireless form. For example, the interface 4140 may include an antenna, or a wired or wireless transceiver, etc. Although not illustrated, the electronic system 4100 may include an operation memory element for improving an operation of the controller 4110 and may further include a high-speed dynamic RAM (DRAM) device, and/or an SRAM device, etc.

The electronic system 4100 may be applied to a cellular phone, a desktop computer, a notebook computer, a tablet personal computer (PC), a game machine, a navigation device, a digital camera, a personal digital assistant (PDA), a wireless phone, digital music player, or any electronic product capable of transmitting and/or receiving information in a wireless environment.

FIG. 11A through 11E are cross-sectional views sequentially illustrating a method of manufacturing the memory card 100 according to an example embodiment. Particularly, the cross-sectional views of FIGS. 11A through 11E may be cross-sectional views along line II-II' in FIG. 1B.

Figure 11A:
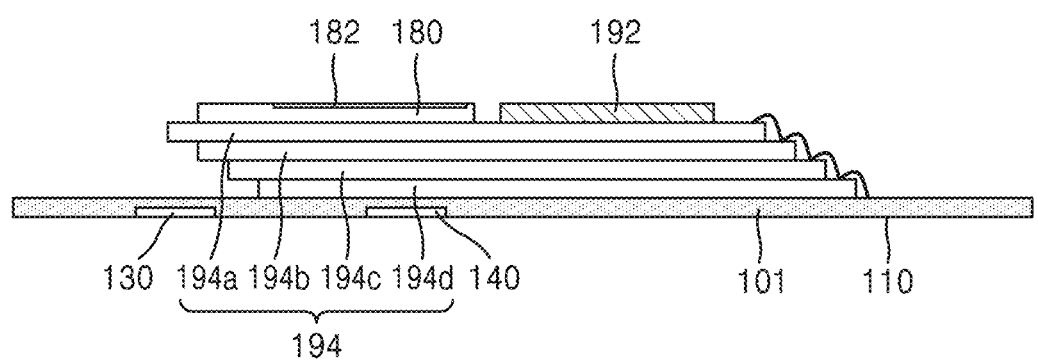
FIGS. 11A through 11E are cross-sectional views sequentially illustrating a method of manufacturing a memory card, according to an example embodiment.

Referring to FIG. 11A, the memory device 194 may be mounted on the substrate 101.

For example, the substrate 101 may be a PCB. The memory device 194 may be mounted on a top surface of the substrate 101, and a first row terminal 130 and a second row terminal 140 may be arranged on a bottom surface of the substrate that is opposite to the top surface thereof. The memory devices 194 may include a plurality of memory devices (e.g., the first memory device 194a, the second memory device 194b, the third memory device 194c, and the fourth memory device 194d). The memory devices 194 may be mounted on the substrate 101 by using a die attach film, an adhesive, or a nonconductive film, etc. Further, the memory devices 194 may be electrically connected to the substrate 101 via the bonding wire(s) BW.

The memory controller 192 may be arranged on the first memory device 194a (e.g., the uppermost one of the memory devices 194). Further, the interposer 180 may be arranged on the first memory device 194a. The memory devices 194, the memory controller 192, and the interposer 180 have been described in detail with reference to FIGS. 1A through 2, and thus detailed descriptions thereof are omitted here.

In some example embodiments, the memory controller 192 and the interposer 180 may be electrically connected to each other by using bonding wire(s) BW. In some example embodiments, the memory controller 192 may be electrically connected to the substrate 101 by using the bonding wire(s) BW. However, the bonding wire(s) BW may interfere with a film subsequently laminated thereon. In FIG. 11A, first bonding wires including bonding wires BW between the plurality of memory devices 194 and a bonding wire BW between the fourth memory device 194d and the substrate 101 are formed. The remaining bonding wire(s) may be formed later. However, the inventive concepts are not limited thereto.

Further, although the interposer 180 and the memory controller 192 are illustrated to be arranged side by side in FIG. 11A, the memory controller 192 may be mounted on the interposer 180 (e.g., on a top surface of the interposer 180) as illustrated in FIGS. 3A and 3B. Further, the memory controller 192 may be arranged such that the memory controller 192 is connected to the conductor line 182a formed on the first memory device 194a (e.g., on the top surface of the first memory device 194a), without providing the interposer 180.

Figure 11B:
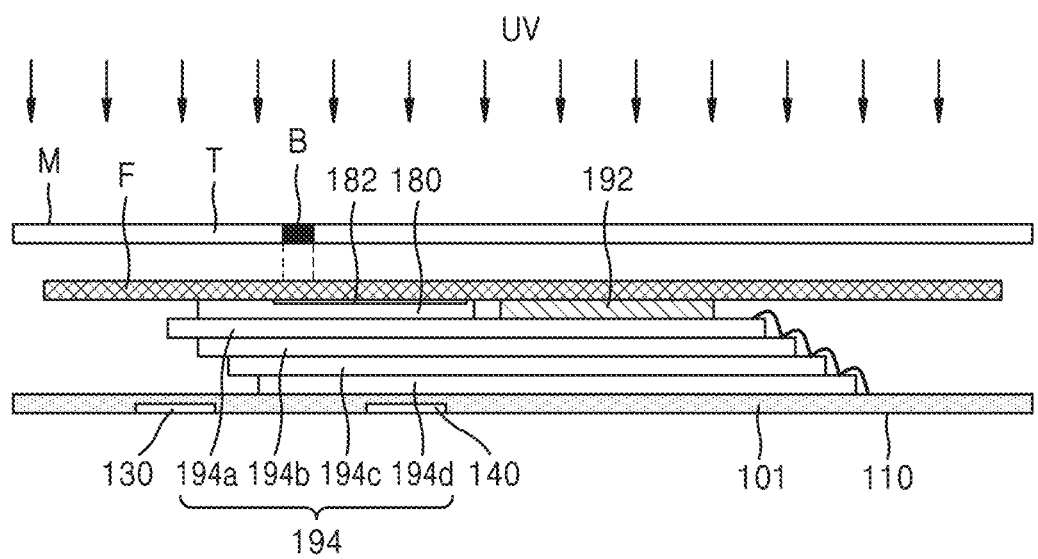

Referring to FIG. 11B, a photosensitive film F may be attached to the top surfaces of the memory controller 192 and the interposer 180.

An adhesive property of the photosensitive film F may be changed through, for example, an exposure process. For example, when the photosensitive film F is exposed to ultraviolet rays UV by using an exposure mask M, the photosensitive film F may have a property that an adhesive force of a portion of the photosensitive film F exposed to the ultraviolet rays UV is decreased or removed, while the adhesive force of a portion of the photosensitive film F not exposed to the ultraviolet rays UV is maintained. Here, the exposure mask M may have a pattern of a transparent portion T and an opaque portion B, and the photosensitive film F may be irradiated with the ultraviolet rays UV through the exposure mask M.

Then, the portion of the photosensitive film F corresponding to the opaque portion B blocking the ultraviolet rays UV may maintain the original adhesive force of the photosensitive film F as is. In addition, the adhesive force of the portion of the photosensitive film F corresponding to the portion T transmitting the ultraviolet rays UV may be reduced or eliminated by the ultraviolet rays UV.

Figure 11C:
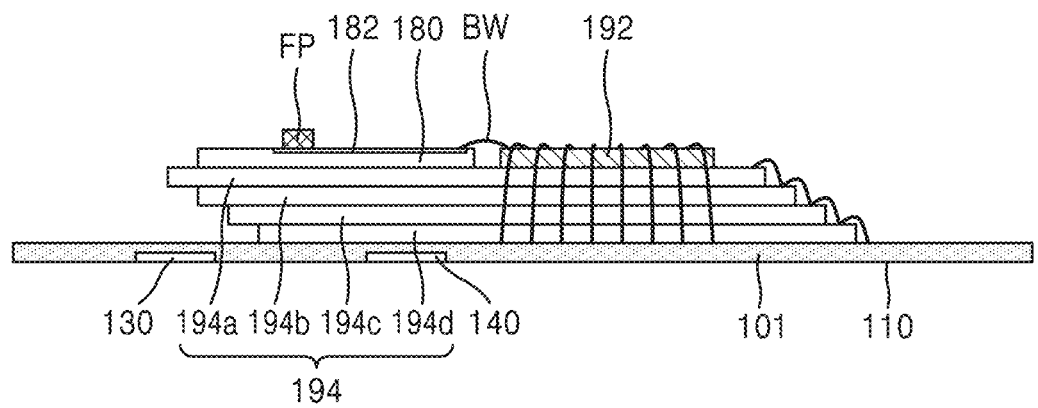

Referring to FIG. 11C, a film pattern FP may be obtained by peeling off and removing a denatured portion (e.g., a portion where the adhesive force is reduced or eliminated) of the photosensitive film F.

Further, the memory controller 192 may be electrically connected to the interposer 180 by using second bonding wire(s) BW. Further, the memory controller 192 may be electrically connected to the substrate 101 by using third bonding wire(s) BW. According to some example embodiments, in the case that the bonding wire(s) BW does not interfere with a film laminated thereon (e.g., the photosensitive film F in FIG. 11B and/or a molding layer 162 in FIG. 11D to be explained below), an entirety of the bonding wires (e.g., the first, second, and third bonding wires) may be formed in a process illustrated in FIG. 11A.

Figure 11D:
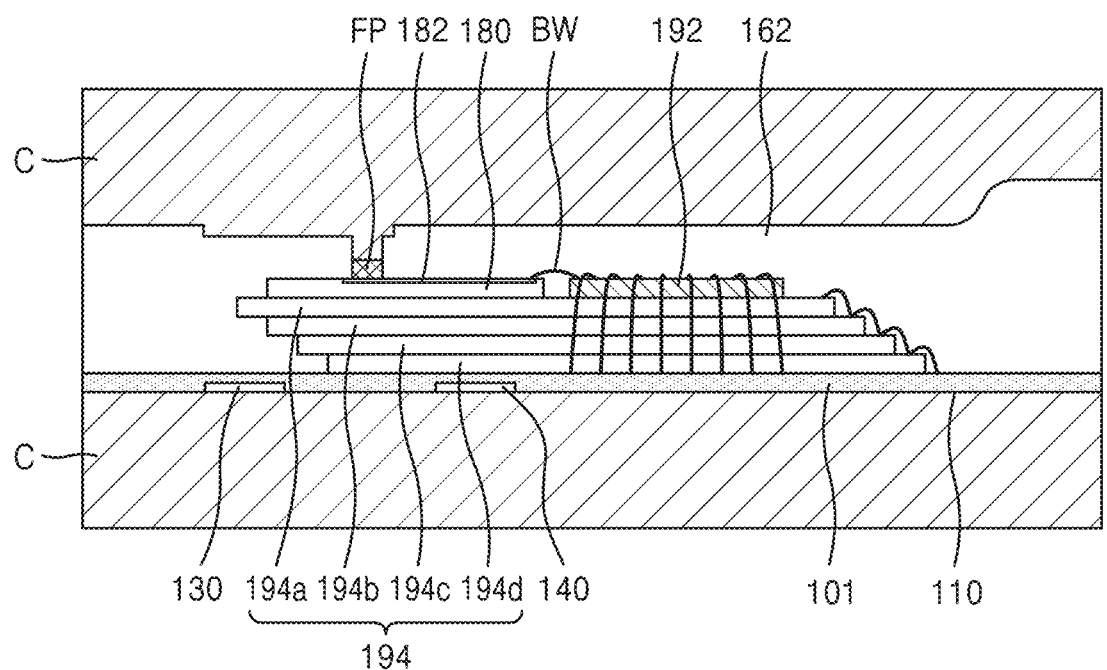

Referring to FIG. 11D, a molding layer 162 may encapsulate the memory controller 192 and the memory devices 194. At this time, after the substrate 101 is fixed in a mold C, the molding layer 162 having fluidity may be injected. For example, the mold C may prevent the molding layer 162 from entering a portion where the conductor via CV is to be formed later. In other words, the mold C may be configured to directly contact the film pattern FP to define a shape of the conductor via CV to be formed later.

Figure 11E:
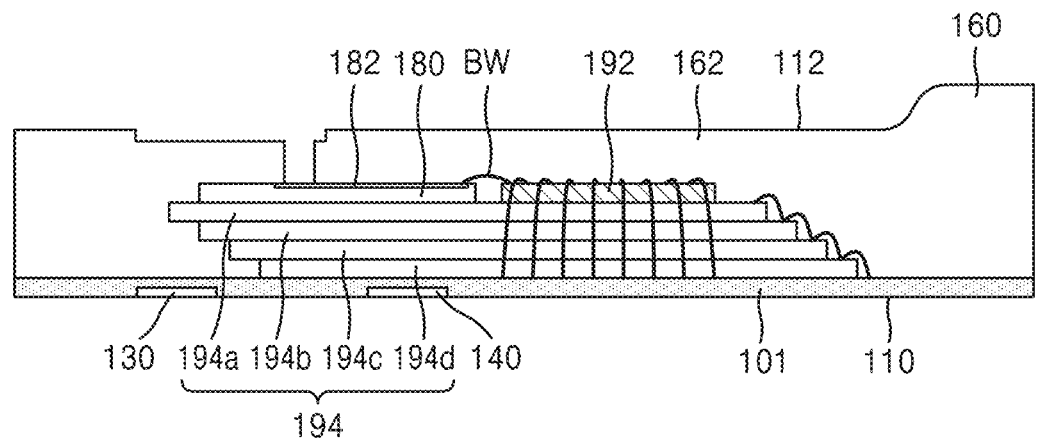

Referring to FIG. 11E, after the mold C is removed, the exposed film pattern FP may be removed. The film pattern FP may be removed by a wet or dry method. In some example embodiments, the film pattern FP may be wet removed by using a chemical agent. In some example embodiments, the film pattern FP may be dry removed through dry-ashing in a hot oxidizing atmosphere.

A portion of the conductor line 182 may be exposed by removing the film pattern FP. The conductor via CV and the second external connection terminals 150 may be formed with respect to the exposed conductor line 182 by a method such as plating (refer to FIG. 2).

When the conductor via CV and the second external connection terminals 150 are simultaneously formed by plating, the interface between the conductor vias CV and the second external connection terminals 150 may not exist.

In some example embodiments, after the conductor via CV is formed by using solder paste, the second external connection terminals 150 may be formed by plating a conductive layer on the conductor via CV. When the conductor via CV and the second external connection terminals 150 are formed as described above, the interface between the conductor via CV and the second external connection terminals 150 may exist.

While the inventive concepts have been particularly shown and described with reference to some example embodiments thereof, it will be understood by those of ordinary skill in the art that various changes in form and details may be made therein without departing from the spirit and scope of the inventive concepts as defined in the appended claims. Accordingly, modifications of the disclosed example embodiments of the inventive concepts will not depart from the scope of the appended claims.

What is claimed is:

1. A memory card comprising a first main surface and a second main surface opposing each other, the memory card comprising:
    a printed circuit board (PCB) establishing the first main surface, the PCB including a plurality of first external connection terminals, the plurality of first external connection terminals exposed on the first main surface;
    a plurality of memory devices stacked on the PCB;
    a memory controller configured to control the plurality of memory devices;
    a molding layer encapsulating the plurality of memory devices and the memory controller, the molding layer establishing the second main surface; and
    one or more second external connection terminals electrically connected to the memory controller, the one or more second external connection terminals embedded in the molding layer and exposed by the molding layer at the second main surface,
    wherein a surface of the one or more second external connection terminals is coplanar with the second main surface,
    wherein the plurality of first external connection terminals comprise,
        a first set of the first external connection terminals in a first row, the first row being adjacent to an insertion-side edge of the memory card, the first set of the first external connection terminals including a power supply terminal of a first voltage and a ground terminal, and
        a second set of the first external connection terminals in a second row, the second row being farther apart from the insertion-side edge than the first row, the second set of the first external connection terminals including a power supply terminal of a second voltage and data terminals.

2. The memory card of claim 1, wherein at least one of the one or more second external connection terminals is connected to a conductive via penetrating the molding layer.

3. The memory card of claim 2, wherein the conductive via extends in a direction perpendicular to the second main surface.

4. The memory card of claim 3, wherein the conductive via is electrically connected to a conductor line extending in a direction parallel to the second main surface.

5. The memory card of claim 4, wherein an end of the conductor line is connected to the conductive via and the other end of the conductor line is connected to the memory controller.

6. The memory card of claim 5, wherein the conductor line is connected to the memory controller via a bonding wire.

7. The memory card of claim 5, wherein the conductive line is provided on a surface of an uppermost one of the plurality of memory devices.

8. The memory card of claim 4, further comprising:
    an interposer between the memory controller and the plurality of memory devices.

9. The memory card of claim 8, wherein
    a planar area of the interposer is greater than that of the memory controller, and
    the conductor line is provided on a surface of the interposer.

10. The memory card of claim 1, wherein the one or more second external connection terminals comprises:
    one or more of (i) a pair of data input/output terminals; or
        (ii) a data input/output terminal having a one-lane structure in which a set of data input terminals and a set of data output terminals each comprise a differential signal pair.

11. A memory card comprising a first main surface and a second main surface opposing each other, the memory card comprising:
    a printed circuit board (PCB) establishing the first main surface, the PCB including a plurality of first external connection terminals, the plurality of first external connection terminals on the first main surface;
    a plurality of memory devices stacked on the PCB;
    a memory controller on an uppermost memory device among the plurality of memory devices;
    a molding layer encapsulating the plurality of memory devices and the memory controller, the molding layer establishing the second main surface;
    one or more second external connection terminals electrically connected to the memory controller, the one or more second external connection terminals embedded in the molding layer and exposed by the molding layer at the second main surface, wherein a surface of the one or more second external connection terminals is coplanar with the second main surface;
    a conductive via penetrating the molding layer, the conductive via being connected to one of the second external connection terminals; and
    a conductor line extending in a direction parallel to the second main surface, an end of the conductor line being connected to the conductive via and the other end of the conductive line being connected to the memory controller via a bonding wire,
    wherein the plurality of first external connection terminals comprise,
        a first set of the first external connection terminals in a first row, the first row being adjacent to an insertion-side edge of the memory card, the first set of the first external connection terminals including a power supply terminal of a first voltage and a ground terminal, and
        a second set of the first external connection terminals in a second row, the second row being farther apart from the insertion-side edge than the first row, the second set of the first external connection terminals including a power supply terminal of a second voltage and data terminals.

12. The memory card of claim 11, further comprising:
    a capacitor, an end of the capacitor being electrically connected to the conductor line and the other end of the capacitor being grounded.

13. The memory card of claim 12, wherein the capacitor is provided in a lateral protrusion provided in a side direction of the second set of the first external connection terminals.

14. The memory card of claim 11, wherein
    the one or more second external connection terminals comprise a power supply terminal configured to supply a supply voltage of about 1.2 V or less, and
    the plurality of first external connection terminals comprise a power supply terminal configured to supply a supply voltage between about 3.3V and about 1.8V.

15. The memory card of claim 11, wherein the plurality of first external connection terminals comprise external connection terminals according to any one standard among a secure digital (SD) card, a micro SD card, a mini SD card, a universal flash storage (UFS) card, or a multimedia card (MMC).

16. The memory card of claim 11, wherein the plurality of first external connection terminals include test terminals covered by a solder resist (SR) layer.

17. A memory card comprising a first main surface and a second main surface opposing each other, the memory card comprising:
- a printed circuit board (PCB) establishing the first main surface, the PCB including a plurality of first external connection terminals, the plurality of first external connection terminals exposed on the first main surface;
- a plurality of memory devices stacked on the PCB;
- a memory controller on an uppermost memory device among the plurality of memory devices;
- a molding layer encapsulating the plurality of memory devices and the memory controller, the molding layer establishing the second main surface;
- one or more second external connection terminals electrically connected to the memory controller, the one or more second external connection terminals embedded in the molding layer and exposed by the molding layer at the second main surface, wherein a surface of the one or more second external connection terminals is coplanar with the second main surface;
- a conductive via extending in a direction perpendicular to the second main surface; and
- a conductor line extending in a direction parallel to the second main surface, an end of the conductor line being connected to the conductive via and the other end of the conductive line being connected to the memory controller via a bonding wire,
- wherein the plurality of first external connection terminals comprise,
- a first set of the first external connection terminals in a first row, the first row being adjacent to an insertion-side edge of the memory card, the first set of the first external connection terminals including a power supply terminal of a first voltage and a ground terminal, and
- a second set of the first external connection terminals in a second row, the second row being farther apart from the insertion-side edge than the first row, the second set of the first external connection terminals including a power supply terminal of a second voltage and data terminals.

18. The memory card of claim 17, wherein the conductor line is not electrically connected to a semiconductor device provided in the plurality of memory devices stacked on the PCB.

19. The memory card of claim 18, wherein the conductor line is provided on a surface of an uppermost one of the plurality of memory devices.

* * * * *